United States Patent
Phan et al.

(10) Patent No.: US 6,320,402 B1
(45) Date of Patent: Nov. 20, 2001

(54) PARALLEL INSPECTION OF SEMICONDUCTOR WAFERS BY A PLURALITY OF DIFFERENT INSPECTION STATIONS TO MAXIMIZE THROUGHPUT

(76) Inventors: Khoi A. Phan, 3841 Thousand Oaks Dr., San Jose, CA (US) 95136; Bernard Matt, 555 E. Washington #912, Sunnyvale, CA (US) 94086; Nicholas R. Maccrae, 5953 Crimson Dr., San Jose, CA (US) 95120

(*) Notice: Subject to any disclaimer, the term of this patent is extended or adjusted under 35 U.S.C. 154(b) by 0 days.

(21) Appl. No.: 09/498,230
(22) Filed: Feb. 3, 2000
(51) Int. Cl.[7] .............................. G01R 31/26; B65G 49/07
(52) U.S. Cl. ........................ 324/765; 324/158.1; 414/935; 414/936; 414/937; 414/939
(58) Field of Search ................................. 324/765, 158.1; 438/17, 106, 907; 414/935, 936, 937, 939; 700/112; 29/25.01

(56) References Cited

U.S. PATENT DOCUMENTS

| | | | |
|---|---|---|---|
| 4,027,246 | * 5/1977 | Caccoma et al. | 700/121 |
| 5,297,910 | * 3/1994 | Yoshioka et al. | 414/226 |
| 5,455,894 | * 10/1995 | Conby et al. | 700/247 |
| 5,661,408 | * 8/1997 | Kamieniecki et al. | 324/765 |
| 5,668,056 | * 9/1997 | Wu et al. | 438/106 |
| 5,976,199 | * 11/1999 | Wu et al. | 29/25.01 |
| 6,021,380 | * 2/2000 | Fredriksen et al. | 702/35 |
| 6,069,017 | * 5/2000 | Kamieniecki et al. | 438/17 |
| 6,140,827 | * 10/2000 | Wark | 324/758 |
| 6,176,667 | * 1/2001 | Fairbairn et al. | 414/217 |

* cited by examiner

*Primary Examiner*—Glenn W. Brown
*Assistant Examiner*—Wasseem H. Hamdan

(57) ABSTRACT

A system for inspecting semiconductor wafers of at least one lot of semiconductor wafers for proper integrated circuit fabrication includes multiple different inspection stations. Each of the different inspection stations inspects a respective integrated circuit fabrication feature of a semiconductor wafer. In addition, a semiconductor wafer robotic handling system, that is coupled to each of the inspection stations, transfers the semiconductor wafers between the inspection stations. Furthermore, a host server is coupled to the inspection stations and the semiconductor wafer robotic handling system. The host server controls the semiconductor wafer robotic handling system to transfer a predetermined one of the semiconductor wafers to a predetermined one of the inspection stations at a predetermined time. Also, the host server controls each of the different inspection stations to simultaneously inspect in parallel a respective one of the semiconductor wafers for the respective integrated circuit fabrication feature. Because the semiconductor wafers are inspected in parallel through the multiple different inspection stations, throughput during manufacture of the semiconductor wafers is maximized. The present invention may be used to particular advantage when the plurality of different inspection stations are for ADI (After Development Inspection) in a photolithography process.

20 Claims, 4 Drawing Sheets

PARALLEL INSPECTION OF SEMICONDUCTOR WAFERS BY A PLURALITY OF DIFFERENT INSPECTION STATIONS TO MAXIMIZE THROUGHPUT

TECHNICAL FIELD

The present invention relates generally to inspection systems used during fabrication of integrated circuits, and more particularly, to networking a plurality of different inspection stations to a host server that controls the inspection stations to inspect semiconductor wafers in parallel for maximizing throughput during manufacture of integrated circuits.

BACKGROUND OF THE INVENTION

The present invention is described in relation to inspection stations used during photolithography processes for fabrication of integrated circuits on semiconductor wafers. However, the present invention may be used for other types of inspection stations used during other types of integrated circuit fabrication processes.

Photolithography is by now a commonly known process used during fabrication of integrated circuits on semiconductor wafers. Referring to FIG. 1, during a typical photolithography process, material is patterned on a plurality of semiconductor wafers, including a first semiconductor wafer 102, a second semiconductor wafer 104, and a third semiconductor wafer 106, using a photoresist patterning process. The plurality of semiconductor wafers 102, 104, and 106 comprise a lot of semiconductor wafers that are processed as a batch of semiconductor wafers according to a respective recipe corresponding to that lot of semiconductor wafers. Although three semiconductor wafers 102, 104, and 106 are shown in FIG. 1 for clarity of illustration, a lot of semiconductor wafers typically includes a higher number of semiconductor wafers.

Referring to FIG. 1, during a typical photolithography process, each of the semiconductor wafers 102, 104, and 106 is coated with photoresist (step 108 in FIG. 1). Such photoresist is then exposed to an energy source, such as an ultraviolet light source for example, with a patterning mask on the photoresist to create a desired pattern of development on the photoresist (step 110 in FIG. 1). The photoresist is then developed typically by immersing the semiconductor wafers 102, 104, and 106 in a developer solution (step 112 in FIG. 1). Such steps for a typical photolithography process are known to one of ordinary skill in the art of integrated circuit fabrication.

Typically, the semiconductor wafers 102, 104, and 106 are inspected for proper photolithography processing in an ADI (After Development Inspection) process (step 114 in FIG. 1). Such an inspection process typically includes a plurality of different types of inspections. If the lot of wafers 102, 104, and 106 passes the multiple inspections after the development step 112, the photoresist on the wafers 102, 104, and 106 is then etched to pattern the developed photoresist on the wafers 102, 104, and 106 (step 116 in FIG. 1). On the other hand, if the lot of wafers 102, 104, and 106 does not pass any of the multiple inspections after the development step 112, the wafers 102, 104, and 106 are reworked to correct for such inspection failure (step 118 in FIG. 1). The photolithography process may also include performing multiple inspections of the semiconductor wafers 102, 104, and 106 after the etch of the developed photoresist (step 120 in FIG. 1). Such steps for a typical photolithography process are known to one of ordinary skill in the art of integrated circuit fabrication.

Referring to FIGS. 1 and 2, in a typical prior art ADI (After Development Inspection) process, the lot of semiconductor wafers 102, 104, and 106 are inspected serially through a plurality of different inspection stations. (Elements having the same reference number in FIGS. 1 and 2 refer to elements having similar structure and function.) Each of the plurality of different inspection stations inspects a respective integrated circuit fabrication feature of a semiconductor wafer. For the ADI (After Development Inspection) process, the plurality of different inspection stations may include an overlay inspection station 202, a critical dimension inspection station 204, a micro feature inspection station 206, a macro feature inspection station 208, and a defect review inspection station 210, as known to one of ordinary skill in the art of integrated circuit fabrication.

The overlay inspection station 202 checks whether a current mask pattern developed on the photoresist is properly aligned with a prior mask pattern etched in another layer of material on a semiconductor wafer. The critical dimension inspection station 204 checks whether the dimensions of the features developed on the photoresist is within a proper range. The micro feature inspection station 206 and the macro feature inspection station 208 check for the presence of defects on the semiconductor wafer after development of the photoresist. The micro feature inspection station 206 checks for defects that are less than approximately 50 $\mu$m (micrometers) in size, and the macro feature inspection station 208 checks for defects that are greater than approximately 50 $\mu$m (micrometers) in size.

The defect review inspection station 210 typically generates a count, classification, and/or mapping of defects on the semiconductor wafer. The defect review inspection station 210 may be provided by a vendor to be used after the inspection of the semiconductor wafer by the micro feature inspection station 206 and the macro feature inspection station 208, as known to one of ordinary skill in the art of integrated circuit fabrication. Alternatively, the defect review inspection station 210 may be provided by a vendor to be used as part of the critical dimension inspection station 204, as known to one of ordinary skill in the art of integrated circuit fabrication.

Such inspection stations are known to one of ordinary skill in the art of integrated circuit fabrication. In the prior art, such different inspection stations are typically stand-alone machines that may be available from different vendors. In the prior art, the semiconductor wafers 102, 104, and 106 are kept together as a lot as they are inspected through the inspection stations 202, 204, 206, 208, and 210 because of a desire by human operators to keep a lot of semiconductor wafers together during fabrication of the semiconductor wafers.

Thus, the lot of semiconductor wafers 102, 104, and 106 are all processed serially first through the overlay inspection station 202, then through the critical dimension inspection station 204, then through the micro feature inspection station 206, then through the macro feature inspection station 208, and then finally through the defect review inspection station 210. In the prior art, a human operator typically carries the lot of semiconductor wafers 102, 104, and 106 to each of the inspection stations 202, 204, 206, 208, and 210 for inspection in such a serial order. At each inspection station, all of the semiconductor wafers of a lot may be inspected or a chosen one or a few of the semiconductor wafers of a lot may be inspected.

However, such a serial ADI (After Development Inspection) process of semiconductor wafers is slow. For example, such a current serial ADI (After Development Inspection) process takes approximately 4–5 hours for completing the ADI (After Development Inspection) process and is the bottle-neck in throughput of the photolithography process during manufacture of integrated circuits on semiconductor wafers. However, for maintaining quality control during manufacture of integrated circuits, each lot of semiconductor wafers goes through each of the multiple different inspection stations 202, 204, 206, 208, and 210.

Thus, a mechanism is desired for further maximizing the throughput of semiconductor wafers through the multiple different inspection stations during manufacture of integrated circuits on semiconductor wafers.

SUMMARY OF THE INVENTION

Accordingly, in a general aspect of the present invention, a system for inspecting semiconductor wafers of at least one lot of semiconductor wafers for proper integrated circuit fabrication includes a plurality of different inspection stations. Each of the different inspection stations inspects a respective integrated circuit fabrication feature of a semiconductor wafer. In addition, a semiconductor wafer robotic handling system, that is operatively coupled to each of the inspection stations, transfers the semiconductor wafers between the inspection stations. Furthermore, a host server is coupled to the inspection stations and the semiconductor wafer robotic handling system. The host server controls the semiconductor wafer robotic handling system to transfer a predetermined one of the semiconductor wafers to a predetermined one of the inspection stations at a predetermined time. Also, the host server controls each of the different inspection stations to simultaneously inspect in parallel a respective one of the semiconductor wafers for the respective integrated circuit fabrication feature, for maximizing throughput of the semiconductor wafers through the different inspection stations.

The present invention may be used to particular advantage when each inspection station has a respective set of recipes with each recipe of the set being used for inspecting a respective set of integrated circuit fabrication parameters for a respective lot of semiconductor wafers. In that case, the host server controls each inspection station to use a proper recipe for a corresponding lot of each semiconductor wafer transferred to an inspection station. The respective set of recipes for each inspection station may be stored at the host server, and each inspection station then downloads from the host server a proper recipe for a semiconductor wafer of a corresponding lot of semiconductor wafers transferred to an inspection station.

Each inspection station may operate in one of an interface mode and a stand-alone mode. An inspection station interfaces with the semiconductor wafer robotic handling system and the host server to operate under control of the host server when operating in the interface mode. Alternatively, an inspection station stops interfacing with the semiconductor wafer robotic handling system and the host server to operate without control by the host server when operating in the stand-alone mode.

Each inspection station may send to the host server respective data after inspecting the respective integrated circuit fabrication feature of a semiconductor wafer of a respective lot of semiconductor wafers. The host server in that case determines whether the respective data received from each inspection station is within a respective proper range. The host server controls each of the inspection stations to terminate operation if the respective data received from any inspection station is not within the respective proper range.

The present invention may be used to particular advantage when the plurality of inspection stations are for ADI (After Development Inspection) in a photolithography process during fabrication of integrated circuits.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, and 4 refer to elements having similar structure and function.

DETAILED DESCRIPTION

An embodiment of the present invention is described in relation to inspection stations used during photolithography processes for fabrication of integrated circuits on semiconductor wafers. However, the present invention may be used for other types of inspection stations used during other types of integrated circuit fabrication processes.

Figure 3:
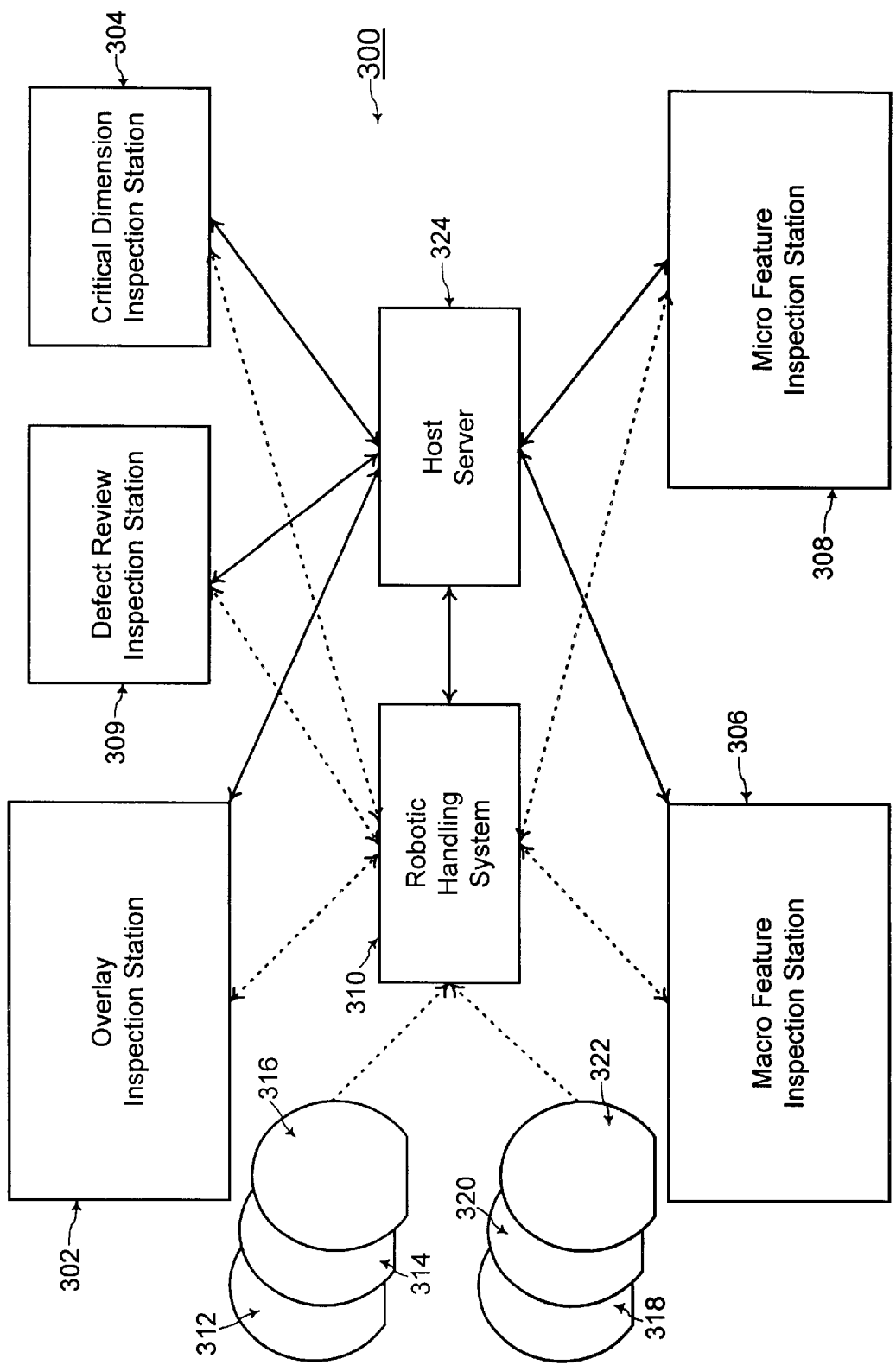
FIG. 3 shows components of an ADI (After Development Inspection) system having parallel processing of semiconductor wafers through the multiple inspection stations for maximizing throughput during fabrication of integrated circuits on semiconductor wafers, according to one embodiment of the present invention.

Referring to FIG. 3, an ADI (After Development Inspection) system 300 maximizes throughput of semiconductor wafers through multiple different inspection stations used during a photolithography process for manufacture of integrated circuits on semiconductor wafers. The multiple different inspection stations include an overlay inspection station 302, a critical dimension inspection station 304, a micro feature inspection station 306, a macro feature inspection station 308, and a defect review inspection station 309, as already described herein and as known to one of ordinary skill in the art of integrated circuit fabrication. Each of these different inspection stations inspects a respective integrated circuit fabrication feature during photolithography processing of a semiconductor wafer after development of the photoresist on the semiconductor wafer, as already described herein and as known to one of ordinary skill in the art of integrated circuit fabrication.

The inspection system 300 further includes a semiconductor wafer robotic handling system 310, coupled to each of the inspection stations 302, 304, 306, 308, and 309, for transferring semiconductor wafers between the inspection stations 302, 304, 306, 308, and 309. The semiconductor wafers to be inspected by the inspection system 300 are input to the semiconductor wafer robotic handling system 310. The semiconductor wafers inspected at any give time by the inspection system 300 may comprise at least one lot of semiconductor wafers. Semiconductor wafers of a given lot are generally all similarly processed according to corresponding integrated circuit fabrication recipes.

Referring to FIG. 3 for example, a first lot of semiconductor wafers, comprised of a first semiconductor wafer 312, a second semiconductor wafer 314, and a third semiconductor wafer 316, is input to the robotic handling system 310. In addition, a second lot of semiconductor wafers, comprised of a fourth semiconductor wafer 318, a fifth semiconductor wafer 320, and a sixth semiconductor wafer 322, is input to the robotic handling system 310.

The inspection system 300 further includes a host server 324 that is coupled to the robotic handling system 310 and to each of the different inspection stations 302, 304, 306, 308, and 309. During operation of the inspection system 300, the host server 324 controls the semiconductor wafer robotic handling system 310 to transfer a predetermined one of the semiconductor wafers 312, 314, 316, 318, 320, and 322 to a predetermined one of the inspection stations 302, 304, 306, 308, and 309 at a predetermined time. The host server 324 also controls each of the inspection stations 302, 304, 306, 308, and 309 to simultaneously inspect in parallel a respective one of the semiconductor wafers 312, 314, 316, 318, 320, and 322 for the respective integrated circuit fabrication feature of each inspection station.

The host server 324 may be any type of data processing machine such as PC's (Personal Computers) or other types of computers, as known to one of ordinary skill in the art of electronics. In addition, semiconductor wafer robotic handling systems are also known to one of ordinary skill in the art of integrated circuit fabrication.

Figure 4:
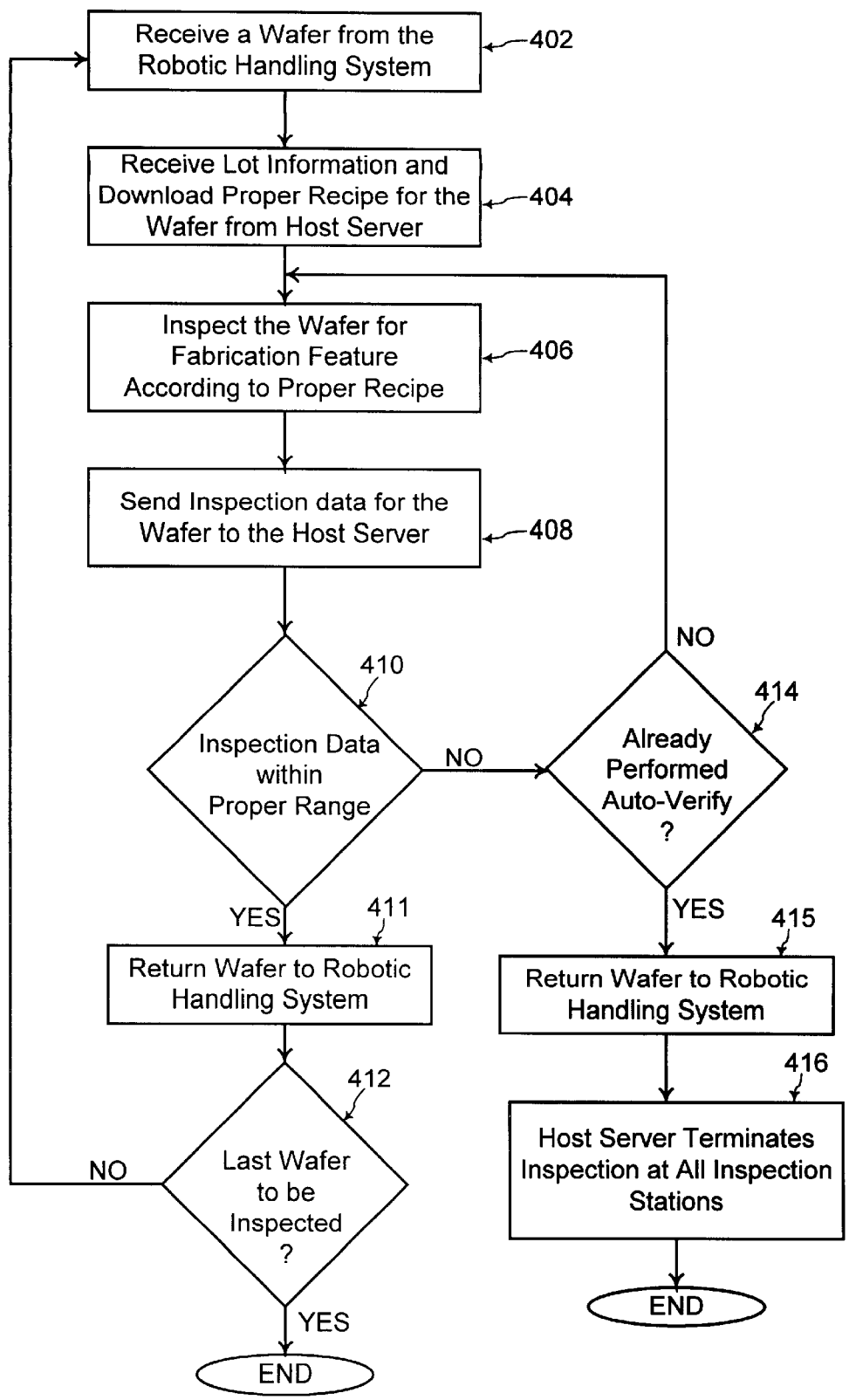
FIG. 4 shows a flowchart of steps performed at an inspection station of FIG. 3 during operation of the ADI (After Development Inspection) system of FIG. 3.

Referring to FIG. 4, a flowchart illustrates the steps of operation of one of the inspection stations 302, 304, 306, 308, and 309 of FIG. 3. However, each of the inspection stations 302, 304, 306, 308, and 309 is following similar steps of operation as each of the inspection stations 302, 304, 306, 308, and 309 operates simultaneously in parallel, according to the general aspect of the present invention.

Referring to FIG. 4, a cycle of operation of an inspection station begins when the inspection station receives a semiconductor wafer from the robotic handling system 310 (step 402 of FIG. 4). The host server 324 controls the robotic handling system 310 to transfer a respective one of the semiconductor wafers 312, 314, 316, 318, 320, and 322 to each of the inspection stations 302, 304, 306, 308, and 309.

Each of the inspection stations 302, 304, 306, 308, and 309 has a respective set of recipes with each recipe of the set being used for inspecting a respective set of integrated circuit fabrication parameters for a respective lot of semiconductor wafers. For example, if the inspection station is the critical dimension inspection station 304, then the first lot of semiconductor wafers 312, 314, and 316 may require checking a dimension size of the developed photoresist layer for patterning metal lines whereas the second lot of semiconductor wafers 318, 320, and 322 may require checking a different dimension size of the developed photoresist layer for patterning via holes.

Thus, referring to FIG. 4, after the inspection station receives a semiconductor wafer, the inspection station receives lot information corresponding to that semiconductor wafer from the host server 324 (step 404 of FIG. 4). In this manner, the host server controls each of the inspection stations 302, 304, 306, 308, and 309 to use a proper recipe corresponding to the lot of the semiconductor wafer received at each of the inspection stations 302, 304, 306, 308, and 309. In one embodiment of the present invention, the respective sets of recipes for each of the inspection stations 302, 304, 306, 308, and 309 is stored at the host server 324. Referring to FIG. 4, in that case, the inspection station downloads the proper recipe corresponding to the respective lot of the semiconductor wafer to be inspected from the host server 324 (step 404 of FIG. 4).

Referring to FIG. 4, when the inspection station has determined the respective lot information and the proper recipe of the semiconductor wafer to be inspected, the inspection station inspects the semiconductor wafer for the respective fabrication feature of that inspection station according to the proper recipe (step 406 of FIG. 4). During such inspection of the semiconductor wafer, the inspection station gathers data of the inspected integrated circuit fabrication feature corresponding to that semiconductor wafer. For example, when the inspection station is the critical dimension inspection station 304, such an inspection station measures dimensions of the pattern developed on the photoresist layer of the semiconductor wafer and gathers the dimensions data for the semiconductor wafer.

The inspection station sends such data relating to the inspection of the semiconductor wafer to the host server 324 (step 408 of FIG. 4). The host server 324 then determines whether such data corresponding to the semiconductor wafer is within a proper range for the lot of that semiconductor wafer (step 410 of FIG. 4). If such data is within the proper range, then the inspection station returns the inspected wafer to the robotic handling system 310 (step 411 of FIG. 4) and receives another wafer to be inspected, and the operation of the inspection station repeats at step 402 if the currently inspected semiconductor wafer is not the last wafer to be inspected (step 412 of FIG. 4). On the other hand, if the currently inspected semiconductor wafer is the last wafer to be inspected (step 412 of FIG. 4), then the inspection station terminates operation since the robotic handling system 310 does not transfer any subsequent semiconductor wafer to the inspection station.

Referring back to step 410 of FIG. 4, if the data of the inspected integrated circuit fabrication feature corresponding to the currently inspected semiconductor wafer is not within the proper range, then most likely, the whole lot of semiconductor wafers corresponding to such a defective semiconductor wafer is likely to be defective. Such a defective lot of semiconductor wafers may be discarded or may be reworked to correct for such defect. In that case, to save the multiple inspection stations 302, 304, 306, 308, and 309 from unnecessary operations, the host server 324 may control each of the inspection stations 302, 304, 306, 308, and 309 to terminate inspection of the defective lot of semiconductor wafers.

In an alternative embodiment of the present invention, when the data of the inspected integrated circuit fabrication feature corresponding to the currently inspected semiconductor wafer is not within the proper range, the inspection station performs an auto-verify operation of re-inspecting the currently inspected defective semiconductor wafer (step 414 of FIG. 4). For example, if the inspection station is the critical dimension inspection station 304, when the dimensions data for the semiconductor wafer is not within the proper range, the critical dimension inspection station 304 remeasures the dimensions data. If the remeasured data after the re-inspection is still not within the proper range, the critical dimension inspection station 304 returns the semiconductor wafer to the robotic handling system 310 (step 415 in FIG. 4), and the host server 324 controls each of the inspection stations 302, 304, 306, 308, and 309 to terminate inspection of the defective lot of semiconductor wafers (step 416 of FIG. 4).

The host server 324 controls the robotic handling system 310 and the inspection stations 302, 304, 306, 308, and 309 such that each of the inspection stations 302, 304, 306, 308, and 309 continuously and simultaneously performs the operation steps of FIG. 4 for the plurality of semiconductor wafers to be inspected. Thus, the semiconductor wafers 312, 314, 316, 318, 320, and 322 to be inspected are processed in parallel instead of in serial. Such parallel processing significantly improves the time required for inspecting the semiconductor wafers 312, 314, 316, 318, 320, and 322.

In another embodiment of the present invention, each of the inspection stations 302, 304, 306, 308, and 309 operates in one of interface mode and stand-alone mode. An inspection station interfaces with the robotic handling system 310 and the host server 324 to operate under control of the host server 324 as described herein when operating in the interface mode. Alternatively, the inspection station stops interfacing with the robotic handling system 310 and the host server 324 to operate without control by the host server 324 and to operate under manual control by an operator as known in the prior art when operating in the stand-alone mode.

Such a feature of operating in one of interface mode and stand-alone mode is especially advantageous when the robotic handling system 310 or the host server 324 is inoperative. When either of the robotic handling system 310 or the host server 324 is inoperative, the host server 324 sends a stand-alone indicator signal to each of the inspection stations to operate in the stand-alone mode.

The foregoing is by way of example only and is not intended to be limiting. For example, the inspection system 300 of FIG. 3 may include more numerous inspection stations and more numerous semiconductor wafers to be inspected than those illustrated in FIG. 3 for clarity of illustration. Furthermore, the inspection system 300 may include other types of inspection stations than those illustrated in FIG. 3.

Figure 1:
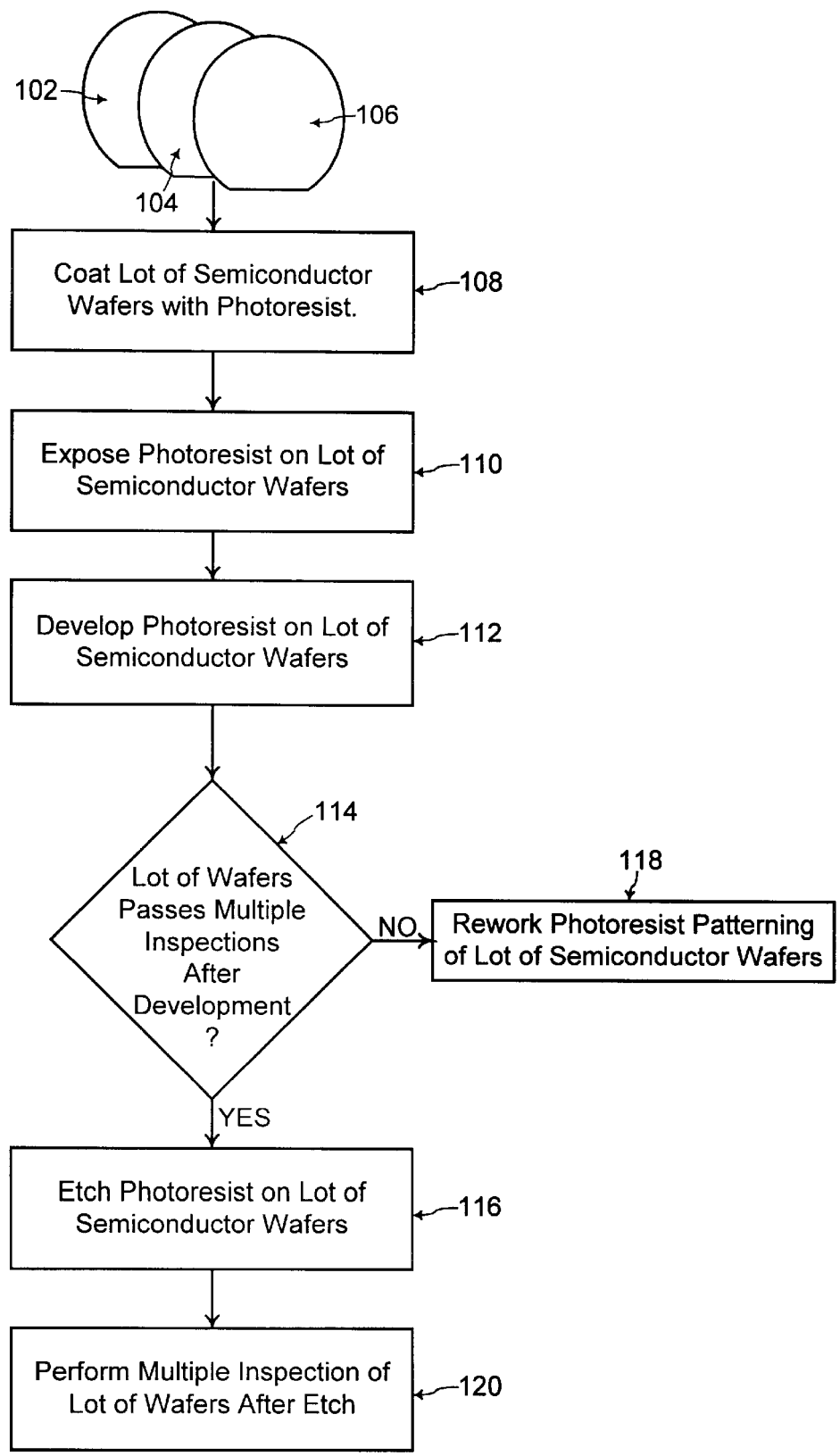
FIG. 1 shows a flowchart of typical steps in a photolithography process including ADI (After Development Inspection)
Figure 2:
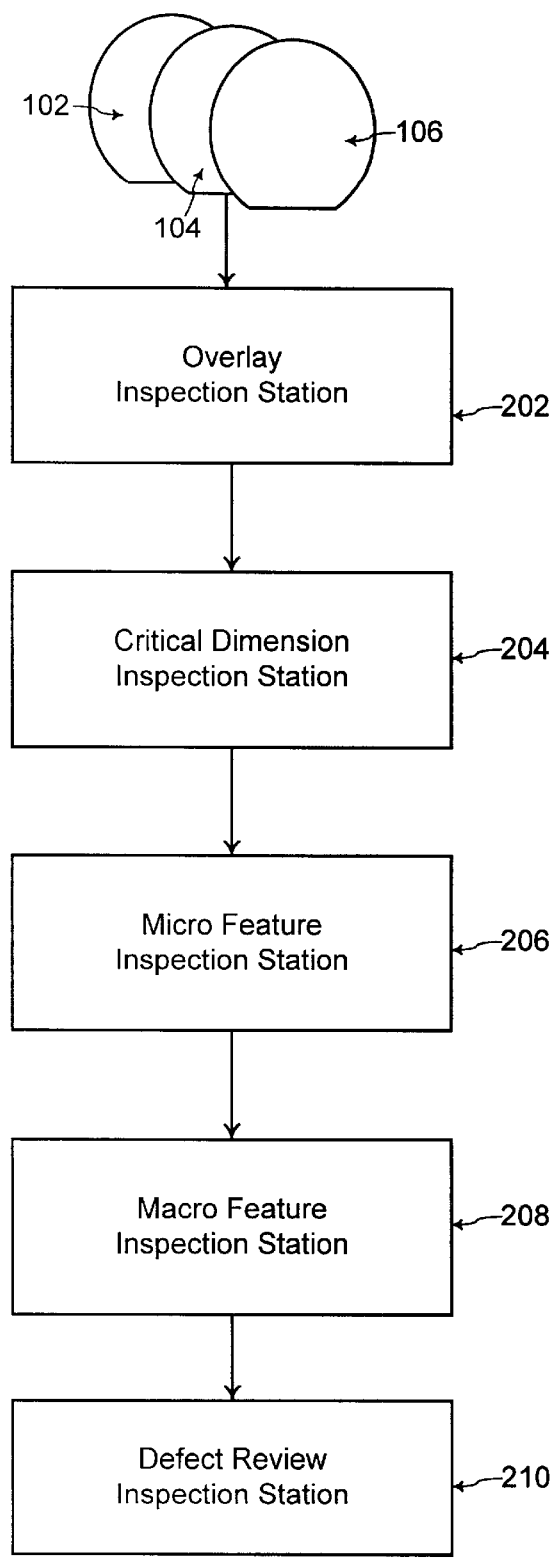
FIG. 2 shows a flowchart of a typical serial ADI (After Development Inspection) process, according to the prior art.

In addition, an embodiment of the present invention is described in relation to inspection stations used during photolithography processes for fabrication of integrated circuits on semiconductor wafers. However, the present invention may be used for other types of inspection stations used during other types of integrated circuit fabrication processes. For example, referring to FIGS. 1 and 3, the inspection system 300 may be used for AEI (after etch inspection) of the semiconductor wafer (step 120 in FIG. 1). In that case, an inspection station within the inspection system 300 includes a film thickness inspection station. Film thickness inspection stations check for proper etching of material on a semiconductor wafer, as known to one of ordinary skill in the art of integrated circuit fabrication.

The present invention is limited only as defined in the following claims and equivalents thereof.

We claim:

1. A system for inspecting semiconductor wafers of at least one lot of semiconductor wafers during integrated circuit fabrication, the system comprising:

a plurality of different inspection stations, wherein each different inspection station inspects a respective integrated circuit fabrication feature of a semiconductor wafer;

a semiconductor wafer robotic handling system, operatively coupled to each of said inspection stations, for transferring said semiconductor wafers between said inspection stations; and a host server, coupled to said inspection stations and said semiconductor wafer robotic handling system;

wherein said host server controls said semiconductor wafer robotic handling system to transfer a predetermined one of said semiconductor wafers to a predetermined one of said inspection stations at a predetermined time;

wherein said host server controls each of said inspection stations to simultaneously inspect in parallel a respective one of said semiconductor wafers for said respective integrated circuit fabrication feature;

wherein each inspection station sends to said host server respective data after inspecting said respective integrated circuit fabrication feature of a semiconductor wafer of a respective lot of semiconductor wafers;

wherein said host server determines whether said repsective data received from each inspection station is within a respective range corresponding to said respective integrated circuit fabrication feature for said inspection station and corresponding to said respective lot of semiconductor wafers, to determine whether said semiconductor wafer passes or fails inspection at said inspection station;

and wherein said host server controls each of said inspection stations to terminate inspection of the lot of semiconductor wafers corresponding to said semiconductor wafer that has failed inspection at said inspection station.

2. The system of claim 1, wherein each inspection station has a respective set of recipes with each recipe of said set being used for inspecting a respective set of integrated circuit fabrication parameters for a respective lot of semiconductor wafers, and wherein said host server controls each inspection station to use a respective recipe corresponding to a lot of each semiconductor wafer transferred to an inspection station.

3. The system of claim 2, wherein said respective set of recipes for each inspection station is stored at said host server, and wherein each inspection station downloads from said host server a respective recipe, for a semiconductor wafer, corresponding to a lot of semiconductor wafers transferred to an inspection station.

4. The system of claim 1, wherein each inspection station operates in one of interface mode and stand-alone mode, and wherein an inspection station interfaces with said semiconductor wafer robotic handling system and said host server to operate under control of said host server when operating in said interface mode, and wherein an inspection station stops interfacing with said semiconductor wafer robotic handling system and said host server to operate without control by said host server when operating in said stand-alone mode.

5. The system of claim 4, wherein said host server sends a stand-alone indicator signal to each of said inspection stations for controlling said inspection stations to operate in said stand-alone mode when one of said host server and said semiconductor wafer robotic handling systems in inoperative.

6. The system of claim 1, wherein said host server controls an inspection station to re-inspect said respective integrated circuit fabrication feature of a semiconductor wafer if said respective data received from said inspection station is not within said respective range.

7. The system of claim 6, wherein said host server controls each of said inspection stations to terminate inspection of said respective lot of semiconductor wafers if said respective data received from said inspection station for a defective semiconductor wafer of said lot of semiconductor wafers is not within said repsective range after said inspection station re-inspects said respective integrated circuit fabrication feature of said defective semiconductor wafer.

8. The system of claim 1, wherein said plurality of inspection stations are for ADI (After Development Inspection) in a photolithography process during fabrication of integrated circuits.

9. The system of claim 1, wherein said plurality of inspection stations are for AEI (After Etch Inspection) in an etching process during fabrication of integrated circuits.

10. A system for inspecting semiconductor wafers of at least one lot of semiconductor wafers during integrated circuit fabrication, the system comprising:

a plurality of different inspection stations, wherein each different inspection station inspects a respective integrated circuit fabrication feature of a semiconductor wafer, and wherein said plurality of inspection stations are for ADI (After Development Inspection) in a photolithography process during fabrication of integrated circuits;

a semiconductor wafer robotic handling system, operatively coupled to each of said inspection stations, for transferring said semiconductor wafers between said inspection stations; and a host server, coupled to said inspection stations and said semiconductor wafer robotic handling system;

wherein said host server controls said semiconductor wafer robotic handling system to transfer a predetermined one of said semiconductor wafers to a predetermined one of said inspection stations at a predetermined time;

wherein said host server controls each of said inspection stations to simultaneously inspect in parallel a respective one of said semiconductor wafers for said respective integrated circuit fabrication feature;

wherein each inspection station has a respective set of recipes with each recipe of said set being used for inspecting a respective set of integrated circuit fabrication parameters for a respective lot of semiconductor wafers, and wherein said host server controls each inspection station to use a respective recipe corresponding to a lot of each semiconductor wafer transferred to an inspection station;

wherein said respective set of recipes for each inspection station is stored at said host server, and wherein each inspection station downloads from said host server a respective recipe, for a semiconductor wafer, corresponding to a lot of semiconductor wafers transferred to an inspection station;

wherein each inspection station operates in one of interface mode and stand-alone mode, and wherein an inspection station interfaces with said semiconductor wafer robotic handling system and said host server to operate under control of said host server when operating in said interface mode, and wherein an inspection station stops interfacing with said semiconductor wafer robotic handling system and said host server to operate without control by said host server when operating in said stand-alone mode;

wherein said host server sends a stand-alone indicator signal to each of said inspection stations for controlling said inspection stations to operate in said stand-alone mode when one of said host server and said semiconductor wafer robotic handling system is inoperative;

wherein each inspection station sends to said host server respective data after inspecting said respective integrated circuit fabrication feature of a semiconductor wafer of a respective lot of semiconductor wafers;

wherein said host server determines whether said respective data received from each inspection station is within a respective range corresponding to said respective integrated circuit fabrication feature for said inspection station and corresponding to said respective lot of semiconductor wafers;

wherein said host server controls an inspection station to re-inspect said respective integrated circuit fabrication feature of a semiconductor wafer if said respective data received from said inspection station is not within said respective range;

and wherein said host server controls each of said inspection stations to terminate inspection of said respective lot of semiconductor wafers if said respective data received from said inspection station for a defective semiconductor wafer of said respective lot of semiconductor wafers is not within said respective range after said inspection station re-inspects said respective integrated circuit fabrication feature of said defective semiconductor wafer.

11. A method for inspecting semiconductor wafers of at least one lot of semiconductor wafers during integrated circuit fabrication, the method including steps of:

coupling a host server to a plurality of different inspection stations and to a semiconductor wafer robotic handling system, wherein each different inspection station inspect a respective integrated circuit fabrication feature of a semiconductor wafer, and wherein said semiconductor wafer robotic handling system transfers said semiconductor wafers between said inspection stations;

controlling said semiconductor wafer robotic handling system, by said host server, to transfer a predetermined one of said semiconductor wafers to a predetermined one of said inspection stations at a predetermined time;

controlling each of said inspection station, by said host server, to simultaneously inspect in parallel a respective one of said semiconductor wafers for said respective integrated circuit fabrication feature;

sending, by each inspection station to said host server, respective data after inspecting said respective integrated circuit fabrication feature of a semiconductor wafer of a respective lot of semiconductor wafers;

determining by said host server whether said respective data received from each inspection station is within a respective range corresponding to said respective integrated circuit fabrication feature for said inspection station and corresponding to said respective lot of semiconductor wafers, to determine whether said semiconductor wafer passes or fails inspection at said inspection station; and controlling, by said host server, each of said inspection stations to terminate inspection of the lot of semiconductor wafers corresponding to said semiconductor wafer that has failed inspection at said inspection station.

12. The method of claim 11, wherein each inspection station has a respective set of recipes with each recipe of said set being used for inspecting a respective set of integrated circuit fabrication parameters for a respective lot of semiconductor wafers, and wherein method further includes the step of:

controlling each inspection station, by said host server, to use a respective recipe corresponding to a lot of each semiconductor wafer transferred to an inspection station.

13. The method of claim 12, wherein said respective set of recipes for each inspection station is stored at said host server, and wherein said method further includes the step of:

downloading from said host server, by each inspection station, a respective recipe, for a semiconductor wafer, corresponding to a lot of semiconductor wafers transferred to an inspection station.

14. The method of claim 11, further including the step of:
operating in on e of interface mode and stand-alone mode by each inspection station, wherein an inspection station interfaces with said semiconductor wafer robotic handling system and said host server to operate under control of said host server when operating in said interface mode, and wherein an inspection station stops interfacing with said semiconductor wafer robotic handling system and said host server to operate without control by said host server when operating in said stand-alone mode.

15. The method of claim 14, further including the step of:
sending a stand-alone indicator signal, by said host server, to each of said inspection stations for controlling said inspection stations to operate in said stand-alone mode when one of said host server and said semiconductor wafer robotic handling system is inoperative.

16. The method of claim 11, further including the step of:
controlling, by the host server, an inspection station to re-inspect said respective integrated circuit fabrication feature of a semiconductor wafer if said respective data received from said inspection station is not within said respective range.

17. The method of claim 16, further including the step of:
controlling, by said host server, cash of said inspection stations to terminate inspection of said respective lot of semiconductor wafers if said respective data received from said inspection station for a defective semiconductor wafer of said respective lot of semiconductor wafers is not within said respective range after said inspection station re-inspects said respective integrated circuit fabrication feature of said defective semiconductor wafer.

18. The method of claim 11, wherein said plurality of inspection stations are for ADI (After Development Inspection) in a photolithography process during fabrication of integrated circuits.

19. The method of claim 11, wherein said plurality of inspection stations are for AEI (After Etch Inspection) in an etching process during fabrication of integrated circuits.

20. A method for inspecting semiconductor wafers of at least one lot of semiconductor wafers during integrated circuit fabrication, the method including steps of:
coupling a host server to a plurality of different inspection stations and to a semiconductor wafer robotic handling system, wherein each different inspection station inspects a respective integrated circuit fabrication feature of a semiconductor wafer, and wherein said semiconductor wafer robotic handling system transfers said semiconductor wafers between inspection stations, and wherein said plurality of inspection stations are for ADI (After Development Inspection) is a photolithography process during fabrication of integrated circuits;
controlling said semiconductor wafer robotic handling system, by said host server, to transfer a predetermined one of said semiconductor wafers to a predetermined one of said inspection stations at a predetermined time;
controlling each of said inspection stations, by said host server, to simultaneously inspect in parallel a respective one of said semiconductor wafers for said respective integrated circuit fabrication feature;
wherein each inspection station has a respective set of recipes with each recipe of said set being used for inspecting set of integrated circuit fabrication parameters for a respective lot of semiconductor wafers, and wherein said method further includes the step of:
controlling each inspection station, by said host server, to use a respective recipe corresponding to a lot of each semiconductor wafer transferred to an inspection station;
wherein said respective set of recipes for each inspection station is stored at said host server, and wherein said method further includes the step of:
downloading from said host server, by cash inspection station, a respective recipe, for a semiconductor wafer, corresponding to a lot of semiconductor wafers transferred to an inspection station;
operating in one of interface mode and stand-alone mode by cash inspection station, wherein an inspection station interfaces with said semiconductor wafer robotic handling system and said host server to operate under control of said host server when operating in said interface mode, and wherein an inspection station stops interfacing with said semiconductor wafer robotic handling system and said host server to operate without control by said host server when operating in said stand-alone mode;
sending a stand-alone indicator signal, by said host server, to each of said inspection stations for controlling said inspection stations to operate in said stand-alone mode when one of said host server and said semiconductor wafer robotic handling system is inoperative;
sending, by each inspection station to said host server, respective data after inspecting said respective integrated circuit fabrication feature of a semiconductor wafer of a respective lot of semiconductor wafers;
determining, by said host server, whether said respective data received from each inspection station is within a respective range corresponding to said respective integrated circuit fabrication feature for said inspection station and corresponding to said respective lot of semiconductor wafers;
controlling, by the host server, an inspection station to re-inspect said respective integrated circuit fabrication feature of a semiconductor wafer if said respective data received from said inspection station is not within said respective range; and
controlling, by said host server, each of said inspection stations to terminate inspection of said respective lot of semiconductor wafers if said respective data received from said inspection station for a defective semiconductor wafer of said respective lot or semiconductor wafers is not within said respective range after said inspection station re-inspects said respective integrated circuit fabrication feature of said defective semiconductor wafer.

* * * * *

UNITED STATES PATENT AND TRADEMARK OFFICE
CERTIFICATE OF CORRECTION

PATENT NO.   : 6,320,402 B1
DATED        : November 20, 2001
INVENTOR(S)  : Khoi A. Phan, Bernard Matt and Nicholas R. Maccrae It is certified that error appears in the above-identified patent and that said Letters Patent is hereby corrected as shown below:

<u>Title page,</u>
Insert Item: -- [73] Assignee: Advanced Micro Devices, Inc.
Sunnyvale, CA (US)

Signed and Sealed this

Twenty-seventh Day of May, 2003

JAMES E. ROGAN
*Director of the United States Patent and Trademark Office*